United States Patent [15] 3,665,507
Peil [45] May 23, 1972

[54] SIGNAL PROCESSOR FOR RECEPTION OF AMPLITUDE OR FREQUENCY MODULATED SIGNALS

[72] Inventor: William Peil, North Syracuse, N.Y.
[73] Assignee: General Electric Company

[22] Filed: Jan. 4, 1971
[21] Appl. No.: 103,425

[52] U.S. Cl. ............................325/315, 325/316, 325/317, 325/318, 325/432, 325/444, 325/451, 325/452, 325/457, 329/1, 330/38 M, 330/69
[51] Int. Cl. ........................................................H04b 1/06
[58] Field of Search ...........................................179/15 BT; 325/315–319, 452, 457, 432, 444, 451; 329/1; 330/38 M, 69

[56] References Cited

UNITED STATES PATENTS 2,637,808 5/1953 Herrick................................325/317
3,548,326 12/1970 Bilotti......................................329/1

*Primary Examiner*—Benedict V. Safourek
*Assistant Examiner*—Albert J. Mayer
*Attorney*—Richard V. Lang, Carl W. Baker, Frank L. Neuhauser, Oscar B. Waddell and Joseph B. Forman

[57] ABSTRACT

A signal processor for the reception of amplitude or frequency modulated signals and the principal signal processing component of an AM-FM radio receiver is described. The processor principally comprises a multiplier-mixer, a wideband amplifier, and a multiplier detector which are operable in both AM and FM modes. The processor is switched from one mode to another by a manual control which converts the IF amplifier from AGC controlled linear amplification for AM to high gain limiting amplification for FM and selectively activates AM and FM signal inputs to the detector and appropriate AM and FM high frequency oscillators for the mixer. The processor is particularly adapted for integrated circuit fabrication techniques.

16 Claims, 2 Drawing Figures

INVENTOR:
WILLIAM PEIL,

BY Richard V. Lang
HIS ATTORNEY.

INVENTOR:
WILLIAM PEIL,

BY Richard V. Lang
HIS ATTORNEY.

SIGNAL PROCESSOR FOR RECEPTION OF AMPLITUDE OR FREQUENCY MODULATED SIGNALS

BACKGROUND OF THE INVENTION

1. Field of the Invention

The present invention relates to radio receivers for AM and FM reception and more particularly to a processor selectively operable to either AM or FM modes. The processor herein described performs the frequency conversion, signal gain and detection functions sharing functional components between AM and FM modes in a manner having particular economies of design for integrated circuit fabrication.

2. Description of the Prior Art

Radio receivers for AM and FM operation have been known for some time and such receivers may be found fabricated by either vacuum tube or transistor techniques. Generally, integrated circuit devices — wherein active and passive components are formed in a monolithic semiconductor chip — have been proposed for functional components of radio receivers but at the present "fully" integrated receivers are not generally available although their introduction is expected.

The term "fully integrated" is used in the sense that "full" integration is achieved when the active and passive components that are practically integrable have been integrated. Generally "full integration" implies that large capacitors, large coils, tuning capacitors, controls, loudspeakers, switches are not integrated, while the active elements — transistors required conductor runs, resistors, small capacitors and sometimes small inductors, have been integrated.

Since the present invention is directed to a processor for performing the major functions required for combined AM and FM receiver operation, certain of the functional circuits employed are in themselves known. For instance, product multipliers are known, and have been proposed for detection and mixing functions. In addition, transistor difference amplifiers have been used as the basic gain element for wideband amplification.

Considering other art relevant to AM-FM receivers, it has been known that the active elements, particularly vacuum tubes, could be shared in the intermediate frequency amplifiers and in the oscillator and mixing functions. The second detection process has ordinarily been sufficiently different as between AM and FM operation that separate circuits and separate vacuum tubes have ordinarily been provided. In transistor configurations for AM-FM receivers, a very common design practice has been to make two largely separate receivers, often using only a common tuning control and common audio signal processing components. In other cases, shared transistors are employed for intermediate frequency amplification. These practices, in part reflect reduced economies in the use of transistors in relation to other complications required for shared operation. At the present, "fully integrated" receivers combining AM and FM reception are not generally available.

SUMMARY OF THE INVENTION

Accordingly, it is an object of the present invention to provide an improved signal processor for AM or FM reception.

It is an additional object of the present invention to provide an improved signal processor for AM and FM reception employing semiconductor active elements.

It is a further object of the present invention to provide an improved AM-FM signal processor particularly adapted for integrated circuit fabrication.

It is another object of the present invention to provide an improved detection circuit readily converted from AM to FM detection.

These and other objects of the invention are achieved in a novel signal processor for AM-FM reception comprising a multiplier-mixer, a wideband amplifier, and a multiplier detector. In its practical form, the mixer includes a pair of transistor difference amplifiers connected for multiplication and having two inputs, one for application of the selected input signal and the other for selective connection to separate high frequency oscillators used in the AM and FM modes. The wideband amplifier which is preceded by lumped filters is capable of amplification of the mixed signal through the conventional intermediate frequencies used for AM and FM operation. The multiplier detector takes the practical form of a pair of difference amplifiers connected for multiplication and having separate input sections for AM and FM operation. In AM operation, the detector operates on the stripped carrier mode while in FM operation it operates as a quadrature detector. Electronic switching means are employed for selectively operating the desired high frequency oscillator and the desired input section of the multiplier detector. The electronic switching means responds to a manual switch, which changes the condition on an AGC control line to a given value. When FM operation is sought, this value is made to correspond to that producing high gain operation in the intermediate frequency amplifier, converting it from a gain controlled linear amplification in the AM mode to high gain limiting amplification in the FM mode. The foregoing practical aspects of the invention share the circuitry to a large degree and effect major economies in integrated circuit fabrication.

BRIEF DESCRIPTION OF THE DRAWING

The novel and distinctive features of the invention are set forth in the claims appended to the present application. The invention itself, however, together with the further objects and advantages thereof may best be understood by reference to the following description and accompanying drawings, in which:

Figure 1:
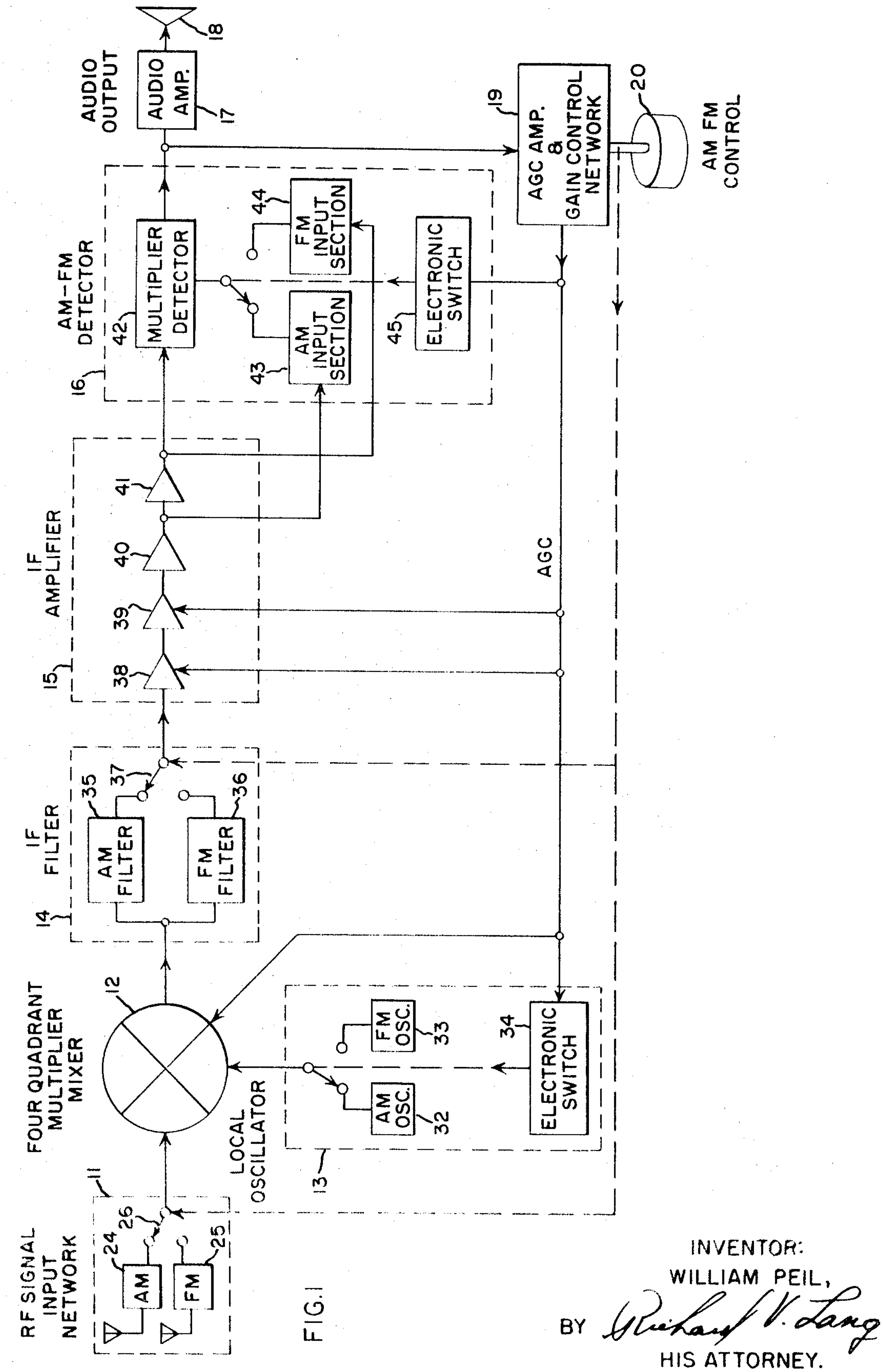
FIG. 1 is a block diagram of a signal processor embodying the invention.

DESCRIPTION OF THE PREFERRED EMBODIMENT:

A radio receiver embodying the invention is shown in simplified block diagram form in FIG. 1. The radio receiver takes the general form of a superheterodyne receiver and is intended for AM-FM operation.

Signal conversion to a fixed intermediate frequency is achieved by the blocks 11, 12 and 13. An RF signal input network is shown as a dotted block at 11. It derives a signal from local antennas and contains tuned circuits 24 and 25 suitable for AM or FM reception, respectively, the mode being selectable by a switch 26, illustrated within the block diagram. The RF signal input network 11 couples the received AM or FM signal to the four quadrant multiplier-mixer 12, where the signal is mixed with a locally generated oscillation derived from the local oscillator shown in the dotted block 13. The local oscillator 13 includes a separate AM oscillator 32 and an FM oscillator 33 which may be selectively connected with the mixer by means of an electronically operated switch 34, also illustrated within the block 13. Signals derived from the mixer 12 appear at a fixed intermediate frequency (455 KHz for AM, 10.7 MHz for FM) and are supplied to the IF filter 14.

Individual signal selection and the principal gain in the radio receiver occurs in the IF filter and IF amplifier blocks 14 and 15, respectively. The IF filter 14 employs two filters, the one bearing reference numeral 35 being for AM operation, and the other bearing reference numberal 36 being for FM operation, and a switching means 37 for selecting the desired AM or FM filter. The filters in 14 are designed to provide the filtering required for adjacent channel selection.

After filtering in 14, the intermediate frequency signal is supplied to the IF amplifier 15. The IF amplifier 15 is a four stage wide band amplifier, providing for linear amplification of the AM signal and limiting amplification of both AM and FM signal. The first three stages have a gain of approximately 55 db in the AM mode and bring the AM signal to a level suitable for detection. In the AM mode, the last stage provides the additional gain (approximately 25 db) necessary to provide limiting action and to drive the detector 16 into a switching mode for AM detection, as will be explained. In the FM mode, all stages 38–41 are set for maximum gain, and limiting occurs at some stage, dependent upon signal strength prior to application to the detector 16.

After suitable filtering and amplification, the selected AM or FM signal is detected in the detector 16. The AM-FM detector 16 has four components 42, 43, 44 and 45. The multiplier detector 42 includes a pair of difference amplifiers in a multiplier configuration, while the blocks 43 and 44 are signal input difference amplifiers for applying the AM signal and the FM signal, respectively, to the multiplier detector 42. The AM and FM input sections 43, 44 are selectively switched in and out of operation by the electronic switch 45.

After detection in the AM-FM detector 16, detected audio signals are applied to the audio amplifier 17 for further amplification and subsequent coupling to the loud speaker 18. At the same time, a detected signal component is derived from the detector output and applied to the AGC amplification and control network 19 for automatic gain control purposes.

The AGC amplification and control network 19 controls the gain of the four quadrant multiplier-mixer 12 and IF amplification stages 38, 39. It also is employed in switching the receiver between AM and FM modes. When voltage on the AGC network is externally increased, the AGC network 19 assists in electronically switching the local oscillator 13 and the second detector 16 between AM and FM modes. A control knob 20 is provided for that purpose connected to the AGC network. When operated, it sets the voltage in the AGC bus to an abnormally high value which activates the mode selective electronic switches 34, 45 as will be explained in greater detail below. Electronic switching may also be provided for switching the RF input signal circuits 24, 25 and the IF filters 35, 36. For simplicity in illustration, the knob 20 is shown coupled to switches 26 and 37, implying that either a mechanical switching linkage or electronic switching may be employed.

Figure 2:
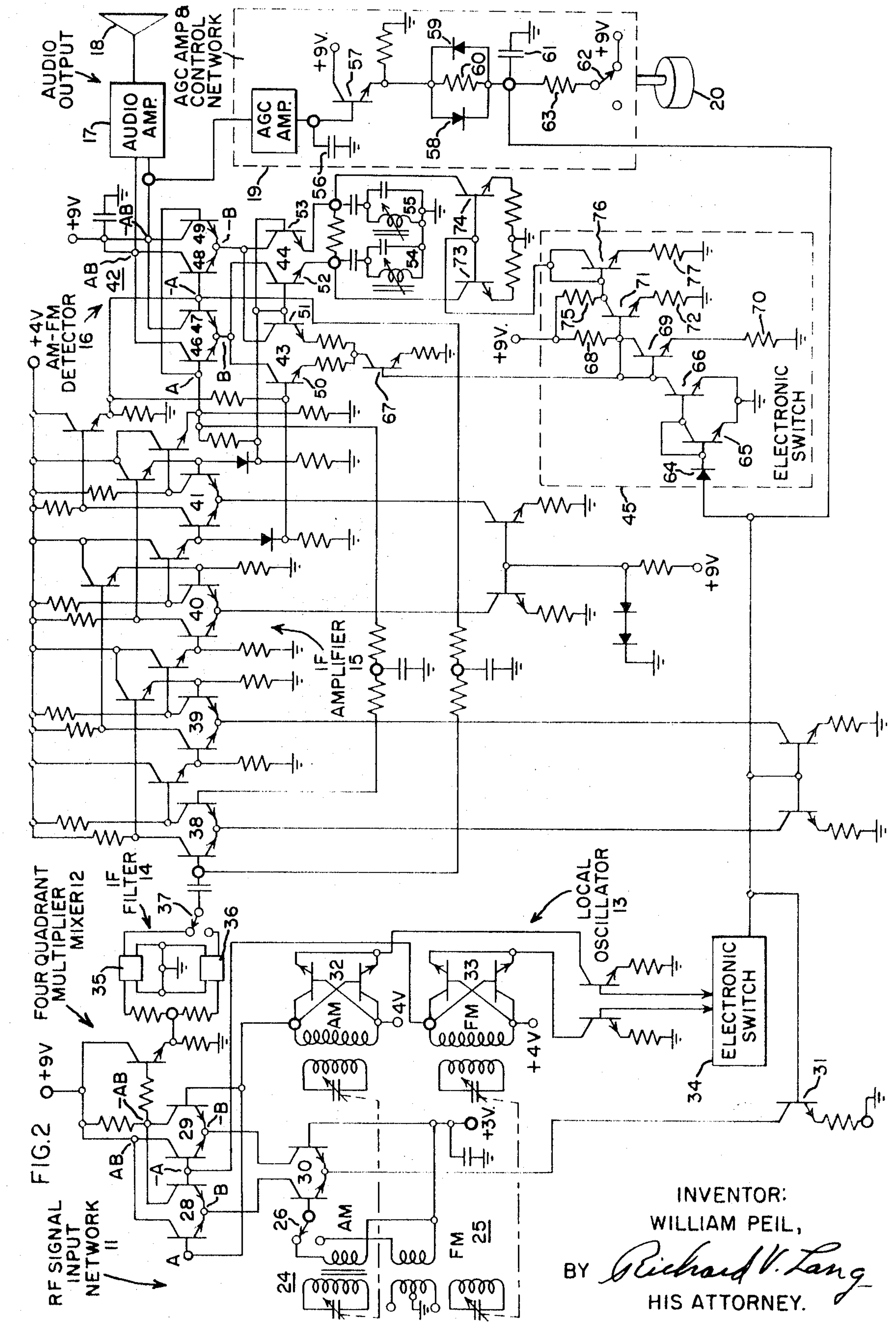
FIG. 2 is an electrical circuit diagram of the same embodiment.

Referring now to FIG. 2, additional circuit details of the practical embodiment illustrated in FIG. 1 are shown. The RF signal input network 11 has an AM section 24 comprising a ferrite core antenna, a primary winding, a variable tuning capacitor for tuning the primary winding, and an untuned secondary arranged to be optionally connected to the mixer through the switch 26. The FM section 25 comprises a filter element having a primary suitable for connection to an external antenna, an inductively coupled tuned resonant circuit, and an untuned secondary output circuit. The FM section 25 is arranged to be optionally connected to the mixer through switch 26.

The four quadrant multiplier-mixer 12 comprises a pair of difference amplifiers 28, 29 in the first or higher rank connected in a multiplier configuration and a single difference amplifier 30 in the second or lower rank. The higher rank, and in particular the paired bases of the difference amplifiers 28 and 29 are denoted the A and −A input terminals of the multiplier (as illustrated). The paired emitters of the difference amplifiers 28, 29 are denoted the B and −B inputs, respectively, and the currents of these points are controlled by the difference amplifier 30. The difference amplifier 30 is of conventional design, and has its emitters connected to a controllable current source 31. Gain of the mixer 12 is controlled by the source 31, which in turn is controlled by the AGC network. The output of the multiplier denoted AB or −AB may be taken from either pair of collectors in the higher rank.

In employing the multiplier-mixer 12 for frequency conversion, both AM and FM sections of the RF input signal network 11 are applied to the base of one transistor in the difference amplifier 30, the base of the other transistor being a.c. grounded. The AM and FM sections of the local oscillator 13 are applied separately to the A and −A inputs, respectively.

The local oscillator 13 as illustrated in additional detail in FIG. 2. The AM oscillator circuit is shown at 32. It is a negative resistance oscillator comprising a transistor pair, a tuned resonant tank circuit with a coupled winding. One collector of each transistor is coupled to each end of the coupled winding, and the base of each transistor is cross coupled to the collector of the other transistor. The emitters are connected together to a current source controlled by the electronic switch 34. The resonant circuit is tuned by means of a tuning capacitor, ganged with the tuning capacitors in the input circuits 24 and 25. The coupling winding of the AM oscillator is connected to the A terminal of the four quadrant multiplier-mixer 12.

The FM section 33 of the local oscillator is also a negative resistance oscillator of the same configuration as the AM section. It also has the emitters of its transistor pairs coupled to a constant current source controlled by the electronic switch 34. Its tuned circuit is tuned by means of a tuning capacitor ganged with the tuning capacitors in the other tuned circuits 24, 25 and 32. The FM oscillator output is connected to the −A terminal of the multiplier-mixer 12.

The four quadrant multiplier-mixer 12 is preferably operated in a switching mode resulting from local oscillator drive. In such operation, the local oscillator voltage is applied to the A,− A terminals of the multiplier in sufficient amplitude to switch the difference amplifiers 28 and 29 between highly conductive states. When so operated, the difference amplifiers act as switches with respect to the input signal applied to the B, −B inputs. This mode of operation is particularly desirable since it tends to reduce nonlinearity in the treatment of the received signal and tends to reduce the generation of spurious signals which might result from any nonlinearity. This mode of adjustment also has the advantage of making the converter insensitive to changes in oscillator output voltage.

The use of a four quadrant multiplier for operation in the vicinity of 100 MHz as is required for FM operation has only recently become possible with the advent of improved high frequency transistor devices. For proper operation of the multiplier, the active components should be chosen for operation at these frequencies.

Selective operation of the AM and FM sections of the local oscillator 13 is achieved by means of the electronic control 34 connected to the current sources in the emitter leads of the oscillator transistor pairs. The electronic switch 34 controls the base voltage of the transistors forming the current sources. Switching is dependent upon voltage in the AGC network. The effect of switching is to turn off the current supplied to the transistor pair in one oscillator section and turn on the current supplied to the transistor pair in the other oscillator section so that only one oscillator section is operable at any one time. This mode of connection permits both the AM and FM sections of the oscillator to be hard wired into this circuit with the mixer.

The signals from the oscillator 13 and from the tuned input circuit 11 are mixed in the multiplier-mixer 12 by a multiplicative process. The mixed output is derived from either the AB or −AB terminal of the mixer and is applied to the IF filter 14.

As previously indicated, the IF filter 14 has separate Am and FM filters 35 and 36, and the filters are selectively introduced into the circuit by means of the switch 37. Both filters are bandpass filters providing sufficient attenuation for the required channel selectivity. The AM filter 34 may take either the form of a ceramic filter, mechanical filter, or a lumped LC filter. Typically, it is tuned to 455 KHz and has a bandwidth of from 6–8 KHz. It provides ultimate channel attenuation on the order of from 60–100 db, depending upon application requirements. The FM filter 35 may also be a ceramic filter or a lumped LC filter. Typically, its bandwidth is 240 kilocycles. Second adjacent channel selectivity is usually greater than 40 db with an ultimate attenuation similar to that in the AM mode.

The IF amplifier 15 provides four stages of signal amplification which are used in both AM and FM operation. Each stage 38, 39 40 and 41 contains a difference amplifier including two transistors, followed by a pair of emitter follower transistors at the output of each stage. The input amplifier 38 has a single ended input connection, coupled to the output of the IF filter 11. Amplification and interstage coupling within the amplifier 15, however, proceeds by a balanced two wire connection with d.c. coupling throughout. Degenerative feedback is used to stabilize the operational d.c. bias of the entire amplifier. Since the amplifier would be capable of amplification from d.c. to high frequencies, degenerative feedback sets the lower frequency limit at below the 455 KHz AM intermediate frequency. The upper frequency limit occurs above the 10.7 MHz FM intermediate frequency and is usually set by the frequency limitations of the active components.

In AM operation, the amplifier 15 provides three stages 38, 39, 40 of linear amplification, and one stage of limiting amplification for use in the detection process. The first and second stages 38 and 39 provide linear amplification subject to automatic gain control by the AGC network, while the third stage 40 operates linearly but with a fixed control bias providing full gain. The last stage 41 is also provided with a fixed control bias and operates at maximum gain. In the AM mode of operation, the stage 41 amplifies the signal to the point where limiting is the intended mode of operation. Thus, a constant amplitude square wave at the intermediate frequency rate and in phase with the intermediate frequency signal being received is produced at the output of amplifier 15. This square wave represents the carrier stripped of its modulation sidebands.

In FM operation, the amplifier 15 provides four stages of amplification, limiting ordinarily occurring in some stage prior to reaching the output of the amplifier. As will be explained, in the FM mode, the AGC control network is provided with a high fixed bias. This causes the mixer and the first two amplifier stages 38 and 39 to operate at high gain. At the same time the stages 40 and 41 operate at high gain from an independent control bias setting. Accordingly, if a strong signal is received limiting may occur in the first or the second amplifier, while if a weak signal is received, limiting will occur in the next to the last stage 40 or last stage 41. Thus, an essentially constant amplitude signal is available at the output of the amplifier 15 at all useful input signal strengths. This constant amplitude output signal is suitable for FM detection in the multiplier detector 16.

As previously indicated, the detector 16 provides both AM and FM detection. It comprises the double balanced four quadrant multiplier 42 having two pairs of difference amplifiers in a higher rank with a separate difference amplifier 43 for AM operation and one (44) for FM operation in a lower rank. In AM operation, the detector 16 operates in the stripped carrier mode. In FM detection, the detector 16 operates as a quadrature detector.

As seen in FIG. 2, the higher rank of difference amplifiers comprises the transistor pairs 46, 47 and 48, 49, respectively. The bases of the transistors 46 and 49 are tied together and form the A input. The A input is connected to the emitter of one emitter follower in the IF amplifier stage 41. The bases of the transistors 47, 48 are also connected together, forming the −A input. The −A input is coupled to the emitter of the other emitter follower in the IF amplifier stage 41. This A — A connection to the final amplifier 41 provides an amplitude limited signal for switching the multiplier in both AM and FM detection.

The lower rank difference amplifier 43 is employed for application of the linear AM input signal. The difference amplifier 43 includes a pair of transistors 50, 51; the collectors of which are connected to the common emitter connections of the transistors 46, 47 (the B input and 48, 49 (the −B input), respectively. The bases of the transistors 50, 51 are connected through voltage dropping diodes to the separate outputs of the third IF stage 40. The emitters of transistors 50, 51 are mutually connected through a degeneration resistance whose center tap is connected to a current source 67 controlled by the electronic switch 45.

In FM operation the lower difference amplifier 44 is employed as the input stage for the quadrature component. It includes a pair of transistors 52, 53, the collectors of which are led, respectively, to the B and −B inputs of the detector multiplier 42. The bases of the transistors 52, 53 are joined and connected through a voltage dropping diode to one emitter follower at the output of the IF amplifier stage 41. The +A input of the detector multiplier 42 is connected to the same emitter follower. The emitter of the transistors 52 is connected to a series resonant tuned circuit 54, the remote terminal of which is grounded. Similarly, the emitter of the transistor 53 is connected to a resonant tuned circuit 55, the remote terminal of which is also grounded. A resistance couples the emitters of the two transistors 52 and 53 together and by lowering the "Q's" of the tuned circuit establishes the desired detection slope. The emitter of the transistor 52 is connected to a constant current source 73 controlled by the electronic switch 45. By a separate connection, the emitter of the transistor 53 is led to a second current source 74 also controlled by the electronic switch 45. As will be explained, the electronic switch 45 permits one transistor pair 50, 51 to operate while the transistor pair 52 and 53 is inoperative, and vice versa.

As previously indicated, the detector 16 operates as a stripped carrier detector in the AM mode. Let one assume that the electronic switch 45 is suitably set to turn on the AM input section 43 containing the transistors 50, 51. The linear signal applied at the bases of transistors 50, 51 is in turn coupled to the B inputs of the transistor pairs 46, 47 and 48, 49. At the same time, the relatively high level stripped carrier derived from the fourth output stage 41 is applied across the A — A input terminals. The presence of these two signals in the multiplier 42 produces a product quantity equivalent to full wave rectification of the input signal.

In practical terms, the higher rank of difference amplifiers are switched by the stripped carrier signal (obtained from the limiting amplifier 41) and switching takes place at the zero crossings of the carrier. At the same time the linearly amplified modulated signal is applied to the bases of the signal input amplifier 43 and controls the currents available at the emitters (the B — B terminals) of the higher rank transistors. This latter connection makes the emitter currents in the higher rank transistors proportional to the momentary amplitude of the linear AM signal.

From the foregoing proportionality and the nature of the multiplication process when in phase signals are multiplied together, the output current waveform appears at multiplier output terminals AB (or −AB) in the form of a full wave rectification of the linear B — B input signal. The rectified waves are all of the same polarity at the same output terminal and have an audio component in proportion to the amplitude modulation and a d.c. component proportional to the carrier level carrier level. One may recover this audio component by suitably filtering the output signal to eliminate the second and higher order terms of the IF carrier.

In FM detection, the detector 16 operates as a quadrature detector. As before, a strongly limited FM signal is applied across the A — A inputs of the difference amplifiers 46, 47 and 48, 49. Assuming that the electronic switch 46 is set to turn off the AM input section 43 and to turn on the FM input section 44, the B — B input is derived from the FM input section.

Let us now consider the B — B input to the detector 16. A second connection is made to the output stage 41, coupling the strongly limited FM signal in common mode to the bases of the transistors 52, 53 in the lower rank of the detector multiplier 16. The tuned circuit 54 is tuned below the IF pass band and produces a lagging current with respect to the applied signal voltage. The phase shift it produces is a function of the momentary frequency deviation of the applied signal and is set at 45° for zero frequency deviation. The same signal is applied to the base of the transistor 53, whose emitter is coupled to the second tuned circuit 55. The tuned circuit 55 is identical to the first except for being set to a frequency above resonance so that it produces a leading phase shift giving rise to a 45° lead at zero frequency deviation. If the instantaneous frequency of the signal rises, the current vectors representing the collector currents in the transistors 52 and 53 will rotate in the same clockwise direction. If the instantaneous frequency falls, the current vectors will rotate in the same counterclockwise direction. These two approximately mutually orthogonal currents, whose phase is a function of the instantaneous frequency deviation are then applied to the B inputs of the upper rank of difference amplifiers 46, 47 and 48, 49.

The current vecotrs just described may be treated as resultant currents which are further resolvable into mutually opposed current vectors — which are the useful components; and mutually aiding current vectors — which, because of common mode rejection in the multiplier when the output is desired in push-pull, are effectively cancelled. While the original, or resultant current vectors, lead and lag the carrier by 45° at zero frequency deviation, the mutually aiding components are in phase with the carrier at zero deviation and the two mutually opposing components are orthogonal to the carrier. As the instantaneous frequency deviation of the FM carrier shifts, the useful mutually opposing current components, however, shift in phase in the same direction and at the same average rate as the resultant currents.

The presence of constant amplitude FM signals at both ports of the upper rank of difference amplifiers 46, 47 and 48, 49 establishes the condition for FM detection by the multiplication process. As previously indicated a strongly limited or constant amplitude FM signal is applied between the A — A inputs of the upper rank of difference amplifiers. The amplitude of this signal is made large so that the difference amplifiers are switched between highly conductive states by the FM signal at the signals zero crossings. At the same time, a second constant amplitude FM signal is applied to the B — B inputs of the detector multiplier 42. The second constant amplitude FM signal is orthogonal to the first at zero deviation but shifts from an orthogonal relationship as the instantaneous frequency of the signal changes. Since the output of the product detector is a function of the sine of the angle between the two applied constant amplitude signals, this variability in mutual phase produces a variation in the amplitude of the output product containing the desired audio modulation.

In practical terms, the detection process may be explained as follows: When the FM signal is undeviated, the multiplier detector 42 produces a succession of rectangular waves of equal positive and negative dwell times. This condition corresponds to the production of a succession of waves at twice the frequency of the IF carrier having a zero d.c. component because of the equality between positive and negative dwell times. When the frequency of the FM signal deviates above center frequency at an audio frequency rate, the A — A waveform whose phase is chosen as the reference, will continue at reference phase as before while the B — B waveform whose phae is made frequency dependent by its application to the tuned circuits 54, 55, now lags the A — A waveform by a different amount than before. A new output condition is created in which the rectangular waves at the output now have lesser positive dwell times and longer negative dwell times. This audio frequency change in the d.c. values produces between the AB and —AB output terminals an audio frequency quantity proportional to the change in mutual phase between the respective inputs.

After suitable filtering, to remove the IF carrier and its harmonics, the audio information is recovered. The detected outputs from 16 are applied in push-pull to the audio amplifier 17 for application to a loud speaker 18. At the same time a detected output is available for automatic frequency control by means not specifically illustrated.

The demodulation of an FM signal in a multiplier detector may employ several theoretical principles. The objective in any case is to derive an electrical signal whose amplitude reproduces the original sound amplitudes. In frequency modulation, the original sound is encosed as a frequency deviation of a radio frequency carrier. In a multiplier, an electrical amplitude corresponding to the original sound information may be obtained by deriving two waves from the FM signal and then producing a product of these waves whose amplitude is dependent on the frequency variation of the signal. This may be done by making the mutual phase of one wave relative to the other dependent on the instantaneous frequency deviation of the signal or by making the amplitude of one wave relative to the other dependent on the instantaneous frequency deviation. The variation of either parameter will produce a desired variation in amplitude in the product of the two waves. Similarly, a variation of both parameters, usually with one predominating, will produce satisfactory amplitude variations.

In the foregoing circuit the detection principle has been explained primarily in terms of a change in mutual angle between the waves. By adjusting the signal levels to a high value at the emitter input (B — B) the angular effect may be made to predominate. On the other hand, it may be desirable to employ some variation in amplitude in an input term to produce more linear reproduction of the original sound. In most practical circuits one effect predominates, but the other is usually present to a lesser degree.

In addition to the foregoing differences in principle of operation, it should be evident that there are several modes of multiplier interconnections. While balanced inputs are frequently desirable in present day integrated circuit applications, one may also use unbalanced input connections. Similarly one may use balanced or unbalanced output connections. Additionally, since the output amplitude is a function of mutual relationships between the vectors, one may delay the waves applied to one set of input terminals or one applied to the other set of input terminals without changing the resultant output.

When a balanced drive is employed as illustrated, the B input connected wave may itself be broken into two components, one shifted forward and the other backward by a pair of frequency dependent phase shift networks. Alternatively, one may use a single frequency dependent phase shift network producing a 90° phase shift at zero frequency deviations.

The AGC control network is shown in somewhat greater detail in FIG. 2. It includes an initial storage capacitor 56 coupled to the base of an isolating emitter follower transistor 57 and providing a first relatively short time constant to remove most of the audio from the AGC control circuit. At the emitter of the transistor follower 57 a pair of mutually reverse connected diodes 58, 59 are provided, shunting a series resistance 60. In conjunction with a second filter capacitor 61, connected between the AGC bus and ground, the components 57 – 60 provide a fast attack-fast release for the AGC circuit during tuning and provides a long time constant when in tune.

The AM-FM control 20 provides means for switching one receiver between Am and FM modes. The control 20 operates the switch 62 for connecting the AGC bus through a resistance 63 to a source of positive bias potentials for FM operation. When this connection is made, the voltage in the AGC bus is raised above the value determined by the signal strength in AM operation (typically from 0.7 to 1.1 volts) to a new value of 1.5 volts. Thus, the mixer and the first two IF stages, which are on the AGC control bus are operated at full gain in the FM setting.

At the same time that the control 20 sets the AGC voltage to a higher value, it also operates the remaining controls required to convert the receiver to the FM mode of reception. This may be accomplished in part by means of mechanical switches and in part by electronic switches or by all mechanical or all electronic switches. Mechanical switches may be used in RF preselection and in IF filter selection at 26 and 37, and electronic switches 34 and 45 may be used to select the appropriate high frequency oscillator and to switch the multiplier detector 16 between the AM and FM modes. Often in integrated circuit applications, mechanical switches are less desirable than electronic switches, such as the electronic switch 45.

For simplicity only the electronic switch 45 has been illustrated in detail. At the input of the electronic switch 45, a first diode 64 and a transistor 65 connected as a diode are provided. The two are connected in series across the AGC control line. A first control transistor 66 is provided having its base connected to the common connection between the components 64, 65, its emitter grounded and its collector connected to the base of the AM input section controlling current source 67 for the control of that source. At the same time the collector of transistor 66 is connected through a resistance 68 to B+ and to the collector of a second transistor 69 operated as a diode. The emitter of component 69 is connected to ground through a resistance 70. A second control transistor 71 is provided having its base connected to the collector of the first control transistor 66, its emitter connected to ground through a resistance 72, and its collected connected to the bases of the FM input section controlling current sources 73, 74 for the control of these sources. The collector of transistor 71 is connected through a resistance 75 to a source of bias potentials and to the collector of a third diode operated transistor 76. The emitter of transistor 76 is connected to ground through a resistance 77.

As previously noted, the electronic switch 45 operates in response to the voltage on the AGC control line to turn on the AM input section of the detector 16 when the voltage on the control line is in the range of from 0.7 to 1.1 volts and to turn on the FM section when the voltage on the control line is in excess of 1.5 volts, a condition established by operation of the switch 62 to connect the AGC control line to a positive source of potentials. As the AGC control line voltage falls by disconnection of the AGC control line from the source, the bias applied to the first control transistor 66 falls and that transistor is turned off. When this occurs, the voltage at the base of the current source 67 is allowed to rise and current to the AM detector section 43 is turned on. At the same time the second control transistor 71 is also turned on, its conduction tending to lower the voltage at the base of the current sources 73 and 74 and to turn off current for the FM detector section. Conversely, when the voltage rises on the AGC control line by operation of the switch 62 to connect the source, the first control transistor 69 becomes conductive, tending to turn off the current source 67, to turn off the control transistor 61, and to turn on the current sources 73, 74 for FM operation. The forced AGC network current for which switching occurs in FM operation is established by the current flowing in the resistor 68 and thus its value controls the actual switching threshold.

The AM-FM detector 16 is electronically switched from the AM to the FM mode by the use of redundant input sections 43, 44, controllable current sources 67, 73, 74 for these input sections and an electronic condition sensing switch 45 sensing conditions upon the AGC control line ultimately set in by the manually operated switch 20.

The advantage of the foregoing approach is that it permits the redundant input sections 43, 44 to be hard wired into the circuit and makes activation of the one section in favor of the other dependent on a change in electrical condition on a readily available control line — the AGC control network. When carried out in the detector 16, there is little or not interaction between the active and the quiescent input stages. This is partly due to the fact that when the redundant connection is made at the emitter input of the multiplier 42, the emitter impedances are usually quite low while the feedthrough impedances from the quiescent input section are quite high.

The same approach may be used with respect to witching other portions of the radio receiver circuit between AM and FM modes. This is suggested in respect to the local oscillator 13. Here the AM section of the local oscillator is applied to the +A connection to the four quadrant multiplier-mixer 12, while the FM oscillator is applied to the −A input connection. The electronic switch 34 operates individual current sources each associated with one oscillator section so as to activate one while de-energizing the other. One oscillator section does not interfere with the other and will provide a ground return path for the other across the A — A inputs of the mixer. Considering the AM circuit to be operating, the inductance in the winding of the FM section of the oscillator provides a low impedance path to the B+ terminal which is at a.c. ground. Assuming FM operation, the distributed capacitance in the winding of the AM section provides a low impedance ground return path.

Similarly, both the RF signal input circuit 11 and the IF filter circuit 14 may be electronically switched between AM and FM modes. The IF filters 35, 36 may be most conveniently introduced by using a redundant input stage 38. The input connections to one of these stages being connected to the filter 35 and the inputs to the other stage being connected to the filter 36. The collector outputs of the redundant stages may be tied together, while their separate emitters are connected to separate current sources under the separate control of an electronic switch similar to that shown at 45.

Similarly, the RF signal input network 11 may be switched between AM and FM modes by the provision of redundant first rank difference amplifiers 30. If this is provided, one signal input section 24 may be coupled to one difference amplifier and the other signal input section 25 may be connected to the other. The collector outputs of the two difference amplifiers may be joined together and connected to the B — B terminals of the multiplier 12. As before, the individual difference amplifiers may have their emitters separately led to separate controlled current sources for control by an electronic switch similar to that shown at 45.

It should be evident that an electronic switch need not be provided for each stage which is subject to mode switching. If the gain of the receiver is moderate, one may employ a single electronic switch for control of the various current sources scattered throughout the radio receiver. If a pair of common control lines is used for this purpose with only a single electronic switch, filtering must be introduced to avoid interstage coupling. With a high gain receiver, isolation by means of a filter is not adequate and at least two electronic switches are likely to be required, one operating with the detector 16 and the other with the blocks 11, 13 and 14.

In achieving a novel radio receiver configuration, operable in either AM or FM modes, a mixer, intermediate frequency amplfier, and detector combination has been selected capable of operation in either mode with minimum change. Such change has been achieved by use of redundant active circuitry without requiring additional switch contacts, or where integrated circuit implementation is contemplated, substantially increasing the minimum number of interconnection pins.

More particularly, a multiplier configuration has been employed for mixer and detector functions and a wideband amplifier has been selected for AM and FM operation. In the mixer, redundant oscillator sections have been provided, while in the detector redundant AM and FM input sections have been provided. Electronic switching has been achieved in such a manner as to leave the precise tuning of the circuits uncompromised by the uncertainty of mechanical switching contacts. In both cases the active elements of the redundant sections have been selectively operated by a current source itself subject to control by an electronic switch responding to an electrical condition manually introduced on a gain control line. When this electrical control is made to correspond to full gain operation of the IF amplifier when FM operation is desired, the IF amplifier and other forward gain elements connected to that control line are operated in the desired limiting high gain mode for FM operation, while the same control line permits automatically controlled linear gain in the amplitude modulation mode.

While the receiver may require switching means, electronic or otherwise, for the RF input circuits and lumped IF filter circuits, the foregoing selection of electronic switches and choice of an electronic control condition for their operation, completes the desired bimodal control of all three major components without requiring additional mechanical switches or connections.

In integrated circuit fabrication, interconnection pins are reduced to a minimum. Such pins are required for interconnecting the integrated circuit ship and the nonintegrable components (tuned circuits, large capacitors, controls, speakers, etc.) of the completed radio receiver. A radio receiver incorporating the present invention may be typically integrated with a minimum requirement of sixteen pins: four being assigned to the various d.c. sources and ground; one to the radio frequency input circuit 11; two to the oscillator sections 32, 33; two to the IF filter 14; two to stabilizing capacitors employed in the intermediate frequency amplifier feedback networks; two to the FM phase shift networks associated with the detector 16; two to the AGC control networks, and finally one to the audio output. These pins have been illustrated in FIG. 2 by the use of enlarged circles at their locations.

Integrated circuit technology is most advanced in respect to bipolar technology. Both gain and multiplication functions may be achieved with transistor devices, typically silicon, and the multiplication function in particular may be performed with difference amplifiers employing transistor pairs, connected for multiplication. Other integrable product devices do exist, such as the MOSFET devices which are now in a state of rapid development. With improvement, they may be expected to perform both the amplifications and multiplication function required in the present application.

What is claimed as new and desired to be secured by Letters Patent of the United States is:

1. A signal processor for amplitude or frequency modulated signals comprising:
   a. a multiplier detector including two difference amplifiers connected for multiplication having base inputs, emitter inputs and collector outputs,
   b. a first source of constant amplitude waves connected to one multiplier detector input, said waves being derived from a selected AM or FM signal and having a given phase relationship with respect to said selected signal.
   c. a second source of waves derived from said selected AM signal, the waves from said second AM source containing the amplitude information of said selected AM signal and having zero crossings coincident with the AM waves from said first source for stripped carrier detection,
   d. a second source of waves derived from said selected FM signal, the waves from said second FM source differing from the FM signal derived waves from said first source in respect to a frequency dependent parameter for achieving product detection,
   e. means for selectively connecting the output of one of said second sources to the other multiplier detector input, and
   f. means coupled to an output of said multiplier detector for deriving the detected waveforms.

2. A signal processor as in claim 1 wherein
   said one multiplier detector input is the base input, the constant amplitude wave applied thereto from said first source being of sufficient amplitude to switch the difference amplifiers in said detector between highly conductive states, and wherein
   said other multiplier detector input is the emitter input.

3. A signal processor as in claim 2 wherein said frequency dependent parameter is the phase thereof, the waves from said second FM source being of substantially constant amplitude.

4. A signal processor as in claim 2 wherein both phase and amplitude are frequency dependent parameters.

5. A signal processor as in claim 3 wherein said frequency dependent phase relationship at said multiplier detector inputs are selected to achieve quadrature FM detection.

6. A signal processor as in claim 2 wherein said first source comprises an intermediate frequency amplifier for signal amplification having sufficient gain to provide an amplitude limited signal in AM or FM operation at the output thereof, and wherein
   said second AM source comprises an initial portion of said intermediate frequency amplifier achieving the intermediate gain required for AM detection and having output connections for deriving a linear AM signal.

7. A signal processor as in claim 6 wherein said second AM source further comprises an amplifier associated with said multiplier detector and having its input connected to the output of the initial portion of said intermediate frequency amplifier, and its output connected to the emitter input of said multiplier detector.

8. A signal processor as in claim 7 wherein phase shifting means are provided for separating the waves from said second FM source into two component waves, one lagging and the other leading the frequency modulated waves from said first source by 45° at zero frequency deviation and having similar phase versus frequency slopes.

9. A signal processor as in claim 8 wherein said phase shifting means comprises a pair of phase shift networks having a frequency dependent phase characteristic, and said second FM source comprises
   a transistor pair associated with said multiplier detector whose bases are connected to the output of said intermediate frequency amplifier, whose emitters are each connected to one of said phase shift networks, and whose collectors are each connected to one of said emitter inputs of said multiplier detector.

10. A signal processor as in claim 3 further comprising an automatic gain control network responsive to the detected output from said multiplier detector and producing on its control line an automatic gain control voltage, and
   a control coupled to said automatic gain control line for optionally changing the voltage on said control line to a value outside the range available from said detected output, and
   voltage responsive means connected to said control line and responsive to said outside value for connecting the output of said second FM source to said other detector input and disconnecting the output of said second AM source.

11. A signal processor as in claim 10 wherein the value of said optional voltage is chosen to operate the amplifier stages coupled to said control line at full gain during FM operation.

12. A signal processor as in claim 11 wherein said second AM source and said second FM source each comprise a controllable current source connected in the emitter paths of the amplifiers thereof associated with said detector multiplier, said controllable current sources being connected to the output of said voltage responsive means for the alternate operation thereof.

13. A signal processor for amplitude or frequency modulated signals comprising:
   a. a multiplier detector having plural inputs,
   b. a first transistor amplifier associated with said detector for applying an AM signal to one input thereof for detection,
   c. a second transistor amplifier associated with said detector for applying an FM signal to one input thereof for detection,
   d. a pair of controllable current sources, each one controlling the current to one of said amplifiers.
   e. a control line,
   f. manual means for setting an electrical parameter to a given value on said control line, and
   g. an electronic switch connected to said control line responsive to said control parameter attaining said value to activate the current source controlling one input amplifier and to inactivate the current source controlling the other input amplifier.

14. A signal processor as set forth in claim 13 comprising
   additional broadband amplifying means for amplifying the AM and FM signal prior to application to said multiplier detector and associated amplifiers, and wherein
   said control line is an automatic gain control line connected to the output of said detector for applying a gain control voltage derived from said output to said additional signal amplifying means during AM operation; and wherein said given value activates said FM mode of operation and establishes full gain in said amplifying means.

15. A signal processor as in claim 14 comprising a. a multiplier mixer having plural inputs, b. a first transistor oscillator associated with said mixer for applying oscillatory waves to one input thereof for mixing AM signals therein, c. a second transistor oscillator associated with said mixer for applying oscillatory waves to an input thereof for mixing FM signals therein, d. a pair of controllable current sources, each one controlling the current to one of said oscillators, and e. an electronic switch connected to said control line, responsive to said control parameter having said value to a activate the current source controlling one oscillator and to inactivate the current source controlling the other oscillator.

16. A signal processor as in claim 15 wherein said multipliers each include a pair of transistor difference amplifiers connected for multiplication.

* * * * *